US009431985B2

(12) United States Patent
Sanders

(10) Patent No.: US 9,431,985 B2
(45) Date of Patent: *Aug. 30, 2016

(54) DYNAMIC ADJUSTMENT OF MASTER AND INDIVIDUAL VOLUME CONTROLS

(71) Applicant: APPLE INC., Cupertino, CA (US)

(72) Inventor: Christopher Sanders, San Jose, CA (US)

(73) Assignee: Apple Inc., Cupertino, CA (US)

( * ) Notice: Subject to any disclaimer, the term of this patent is extended or adjusted under 35 U.S.C. 154(b) by 168 days.

This patent is subject to a terminal disclaimer.

(21) Appl. No.: 14/086,980

(22) Filed: Nov. 22, 2013

(65) Prior Publication Data

US 2014/0079247 A1    Mar. 20, 2014

Related U.S. Application Data

(63) Continuation of application No. 12/967,810, filed on Dec. 14, 2010, now Pat. No. 8,611,559.

(60) Provisional application No. 61/378,795, filed on Aug. 31, 2010.

(51) Int. Cl.
*H03G 3/00* (2006.01)
*H03G 7/00* (2006.01)
(Continued)

(52) U.S. Cl.
CPC ............... *H03G 7/00* (2013.01); *G06F 3/165* (2013.01); *H03G 1/02* (2013.01)

(58) Field of Classification Search
CPC .......... H03G 3/20; H03G 3/301; H03G 3/02; H03G 3/3026
USPC ......................................... 381/109, 104, 119
See application file for complete search history.

(56) References Cited

U.S. PATENT DOCUMENTS 5,910,996 A    6/1999    Eggers et al.
7,349,548 B2   3/2008    Wang
(Continued)

FOREIGN PATENT DOCUMENTS

CN    101192812 A    6/2008
JP    H0358351 A     3/1991
(Continued)

OTHER PUBLICATIONS

International Search Report and Written Opinion mailed on Nov. 25, 2011 for PCT Patent Application No. PCT/US2011/048464, 12 pages.

(Continued)

*Primary Examiner* — Alexander Jamal
(74) *Attorney, Agent, or Firm* — Kilpatrick Townsend & Stockton LLP

(57) ABSTRACT

Techniques for controlling the volumes of multiple audio output devices using a collective (master) volume control and an individual volume control for each audio output device. In one set of embodiments, each individual volume control can be configured to indicate the current absolute volume level of its corresponding audio output device. When the master volume control is manually adjusted, the individual volume controls can be automatically adjusted in a manner proportional to the manual adjustment of the master volume control. In addition, when an individual volume control is manually adjusted to a setting or value that exceeds the master volume control, the master volume control can be automatically adjusted to be equal to, or greater than, the manually adjusted setting for the individual volume control. In this scenario, the other individual volume controls can remain unchanged.

21 Claims, 10 Drawing Sheets

(51) Int. Cl.
*H03G 1/02* (2006.01)
*G06F 3/16* (2006.01)

(56) References Cited

U.S. PATENT DOCUMENTS

| | | | |
|---|---|---|---|
| 7,702,117 | B2 | 4/2010 | Crocitti et al. |
| 8,014,543 | B2 | 9/2011 | Hirano |
| 8,184,834 | B2 | 5/2012 | Oh et al. |
| 8,270,641 | B1 | 9/2012 | Greenberg |
| 8,406,435 | B2 | 3/2013 | Yerrace et al. |
| 8,611,559 | B2 | 12/2013 | Sanders |
| 2004/0013277 | A1 | 1/2004 | Crocitti et al. |
| 2005/0237377 | A1* | 10/2005 | Chapweske ............ H04N 7/15 348/14.08 |
| 2006/0210097 | A1 | 9/2006 | Yerrace et al. |
| 2006/0291666 | A1 | 12/2006 | Ball et al. |
| 2007/0106941 | A1 | 5/2007 | Chen et al. |
| 2008/0075295 | A1 | 3/2008 | Mayman et al. |
| 2008/0214289 | A1* | 9/2008 | Pryzby .................. G07F 17/32 463/25 |
| 2008/0242222 | A1 | 10/2008 | Bryce et al. |
| 2010/0046765 | A1 | 2/2010 | De Bruijn et al. |

FOREIGN PATENT DOCUMENTS

| | | |
|---|---|---|
| JP | H09246891 A | 9/1997 |
| JP | 2006258267 A | 9/2006 |
| JP | 2006270886 A | 10/2006 |
| JP | 2009218948 A | 9/2009 |
| JP | 2010-056970 A | 3/2010 |
| JP | 2011191971 A | 9/2011 |

OTHER PUBLICATIONS

Non-Final Office Action mailed on Dec. 28, 2012 for U.S. Appl. No. 12/967,810, 20 pages.
Preliminary Report on Patentability mailed on Mar. 14, 2013 for PCT Patent Application No. PCT/US2011/048464, 10 pages.
Final Office Action mailed on May 13, 2013 for U.S. Appl. No. 12/967,810, 11 pages.
Notice of Allowance mailed on Aug. 26, 2013 for U.S. Appl. No. 12/967,810, 11 pages.
Notice of Allowance for Japanese Patent Application No. 2013-526048, mailed Jan. 31, 2014, 3 pages.
Office Action for Chinese Patent Application No. 201180041863.8, mailed Aug. 13, 2014, 25 pages.
Office Action mailed Feb. 29, 2016, for European Patent Application No. 11 748 864.3, 7 pages.

* cited by examiner

1

DYNAMIC ADJUSTMENT OF MASTER AND INDIVIDUAL VOLUME CONTROLS

CROSS-REFERENCES TO RELATED APPLICATIONS

This application is a continuation of U.S. application Ser. No. 12/967,810 filed Dec. 14, 2010, which claims the benefit and priority under 35 U.S.C. 119(e) of U.S. Provisional Application No. 61/378,795 filed Aug. 31, 2010, entitled "MASTER VOLUME CONTROL WITH DYNAMIC SUB-VOLUME ADJUSTMENT," the entire contents of which are incorporated herein by reference for all purposes.

BACKGROUND

The present disclosure relates in general to audio systems, and in particular to techniques for controlling the volumes of multiple audio output devices.

In recent years, systems have been developed for distributing audio signals from a single audio source (e.g., computer system, CD/DVD player, MP3 player, etc.) to multiple audio output devices. For example, the iTunes software application developed by Apple Inc. includes a feature known as "AirPlay" that allows computers running iTunes to transmit audio information to satellite devices over wired or wireless local networks. These satellite devices include audio outputs that can connect to an audio receiver or amplifier, which in turn can connect to a set of speakers or another type of audio output device. Collectively, this system enables users to, e.g., distribute audio from their computer to different locations in their homes.

Some conventional audio distribution systems provide a global volume control for controlling the volumes of the connected audio output devices simultaneously. Because these systems send the same volume information to all audio output devices, there is no option for controlling the volume of a single audio output device (independently of the other devices). Other conventional audio distribution systems provide individual volume controls for controlling the volumes of connected audio output devices independently, but at the expense of a global volume control.

Accordingly, it would be desirable to have techniques that facilitate the use of both individual and collective volume controls for controlling multiple audio output devices.

BRIEF SUMMARY

Embodiments of the present invention provide techniques for controlling the volumes of multiple audio output devices using a collective (master) volume control and an individual volume control for each audio output device. In one set of embodiments, each individual volume control can be configured to indicate the current absolute volume level of its corresponding audio output device. In other words, the individual volume control can be adjustable over a range representing the full volume range of the audio output device, and the setting or value for the individual volume control can represent the current volume level of the device relative to that range. Accordingly, a user viewing the individual volume controls can easily and accurately discern the current "loudness" of each audio output device.

In a further set of embodiments, each individual volume control can be automatically adjusted in response to an adjustment of the master volume control. In certain embodiments, this automatic adjustment can be proportional to the adjustment of the master volume control. For example, consider a situation where the master volume control is set to 100%, the individual volume control for an audio output device "A" is set to 100%, and the individual volume control for an audio output device "B" is set to 50%. If the master volume control is adjusted to 50% (a reduction of 50%), the individual volume control for device A can be proportionally reduced by 50% to 50%. Similarly, the individual volume control for device B can be proportionally reduced by 50% to 25%. In this manner, the master volume control can globally modify the volumes of multiple audio output devices while preserving the relative volume differences, in percentage terms, between the devices (as set by their individual volume controls).

In a further set of embodiments, the master volume control can, in certain circumstances, be automatically adjusted in response to an adjustment of an individual volume control. For example, consider the example above where the master volume control has been set to 50%, and where the individual volume controls for audio output devices A and B have been automatically set to 50% and 25% respectively. If the individual volume control for device A is subsequently increased to 75%, the individual volume setting for device A (75%) will exceed the setting for the master volume control (50%). In this scenario, the master volume control can be automatically increased to match or exceed the new individual volume setting for device A (e.g., 75%). At the same time, the individual volume control for device B can remain constant at 25%, thereby recalibrating its proportional relationship with the master volume control. In this manner, users can override the master volume control when they want an particular audio output device (in this example, device A) to be louder than the volume ceiling imposed by the previous master volume control setting, without affecting the current volume levels of other devices.

A further understanding of the nature and advantages of the embodiments disclosed herein can be realized by reference to the remaining portions of the specification and the attached drawings.

DETAILED DESCRIPTION

In the following description, for the purposes of explanation, numerous details are set forth in order to provide an understanding of various embodiments of the present invention. It will be apparent, however, to one skilled in the art that certain embodiments can be practiced without some of these details.

Embodiments of the present invention provide techniques for controlling the volumes of multiple audio output devices using a collective (master) volume control and an individual volume control for each audio output device. In one set of embodiments, each individual volume control can be configured to indicate the current absolute volume level of its corresponding audio output device. When the master volume control is manually adjusted, the individual volume controls can be automatically adjusted in a manner proportional to the manual adjustment of the master volume control. Thus, the master volume control can globally modify the volumes of multiple audio output devices while preserving the relative volume differences, in percentage terms, between the devices (as set by their individual volume controls).

In addition, when an individual volume control is manually adjusted to a setting or value that exceeds the master volume control, the master volume control can be automatically adjusted to be equal to, or greater than, the manually adjusted setting for the individual volume control. In this scenario, the other individual volume controls can remain unchanged. Thus, users can override the master volume control when they want an particular audio output device to be louder than the volume ceiling imposed by the previous master volume control setting, without affecting the current volume levels of other audio output devices controlled by the master volume control.

Figure 1:
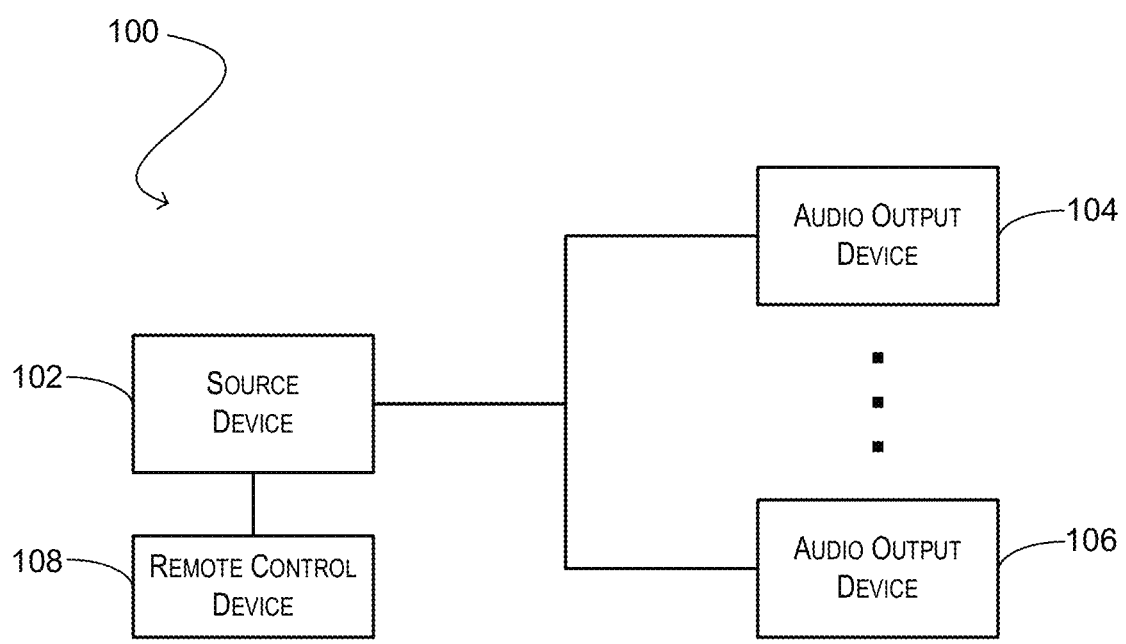
FIG. 1 is a simplified block diagram of a system environment according to an embodiment of the present invention.

FIG. 1 is a simplified block diagram of a system environment 100 according to an embodiment of the present invention. As shown, system environment 100 can include a source device 102 that is communicatively coupled with audio output devices 104, 106. Source device 102 can be configured to distribute audio information in digital or analog form for playback by audio output devices 104, 106. Although only two audio output devices are depicted, it should be appreciated that system environment 100 can support any number of such devices.

In one set of embodiments, source device 102 and audio output devices 104, 106 can be part of a communications network such as a local area network, a wide area network, or the Internet. In these embodiments, source device 102 and audio output devices 104, 106 can communicate via a networking protocol such as Ethernet, TCP/IP, or the like. Alternatively, source device 102 and audio output devices 104, 106 can communicate via point-to-point connections using a proprietary protocol. In various embodiments, the connections between source device 102 and audio output devices 104, 106 can be wired (e.g., serial, USB, Firewire, CAT-5e, speaker wire, etc.) or wireless (e.g., WiFi, Bluetooth, etc.) links.

Although source device 102 is shown in FIG. 1 as being directly connected to audio output devices 104, 106, in some embodiments source device 102 can be connected to an intermediary device, which in turn is connected to audio output device 104 or 106. Merely by way of example, source device 102 can be connected to a wireless receiver which is configured to receive wireless network transmissions from source device 102. The wireless receiver can interpret the wireless transmissions and convert the transmissions to digital or analog audio signals that are passed to audio output device 104 or 106 (through, e.g., an audio out port) for playback.

Source device 102 can be any type of electronic device capable of acting as a source for audio assets. For example, source device 102 can be a computer system, a CD/DVD/Blu-Ray player, a portable media device, a cable or set-top box, a personal video recorder, or the like. Source device 102 can include communications circuitry for communicating with audio output devices 104, 106. Further, source device 102 can include input/output devices for receiving commands and presenting information to a user.

In one set of embodiments, source device 102 can include a display component configured to present a user interface including a number of volume controls. The volume controls can include an individual volume control for controlling the volume of each audio output device 104, 106, as well as a master volume control for controlling the volumes of audio output devices 104, 106 collectively. In these embodiments, source device 102 can receive input commands (via an input device such as a keyboard, mouse, touch-screen, etc.) from a user for manipulating the various volume controls. Upon receiving these input commands, source device 102 can update the user interface to display the updated setting for each volume control, and can send control signals to audio output devices 104, 106 for adjusting their volume levels appropriately. The processing that can be performed by source device 102 when displaying and adjusting the volume controls is described in greater detail below.

Audio output devices 104, 106 can be any type of device capable of playing back audio. For example, audio output devices 104, 106 can be a speaker or speaker set, an audio receiver, a set of headphones, a television, or the like. In one set of embodiments, audio output devices 104, 106 can include communications circuitry for receiving transmissions from source device 102. Alternatively, as mentioned above, audio output devices 104, 106 can be connected to an intermediary device that is configured to receive and interpret transmissions from source device 102. The intermediary device can subsequently generate audio signals based on the received transmissions for driving audio output device 104 or 106.

In some embodiments, audio output devices 104, 106 can also send information to source device 102. For example, if audio output device 104 is an audio receiver with a physical volume knob, an adjustment of the knob can cause the receiver to send a control signal to source device 102 indicating the adjustment. Source device 102 can then update its volume control user interface based on the adjusted volume of the receiver.

In certain embodiments, source device 102 can be remotely controlled by a remote control device 108. Remote control device 108 can be a dedicated remote control or a device that is configured to provide remote control capability in addition to other capabilities. For example, remote control device 108 can be a portable media device such as the iPod, iPhone, or iPad available from Apple Inc., that can provide mobile telephony, Internet access, and other services. In one set of embodiments, remote control device 108 can communicate with source device 102 via a short range wireless transmission medium, such as infrared (IR) or radio frequency (RF) signals. In other embodiments, remote control device 108 can communicate with source device 102 via other wireless mediums, such as WiFi, Bluetooth, or cellular network transmission (e.g., EDGE, 3G, etc.).

In scenarios where source device 102 is controlled by remote control device 108, remote control device 108 can present (via an output device such as a touch-screen or other type of display component) the volume control user interface described above with respect to source device 102. In addition, remote control device 108 can receive input commands (via an input device such as a keyboard, mouse, touch-screen, etc.) from a user for manipulating the various volume controls. Upon receiving these input commands, remote control device 108 can update the user interface to display the updated setting for each volume control, and can send control signals to source device 102 representing the updated volume control settings. In response, source device 102 can send control signals to audio output devices 104, 106 for adjusting their volume levels appropriately.

It should be appreciated that system environment 100 is illustrative and not intended to limit embodiments of the present invention. One of ordinary skill in the art will recognize many variations, modifications, and alternatives.

Figure 2:
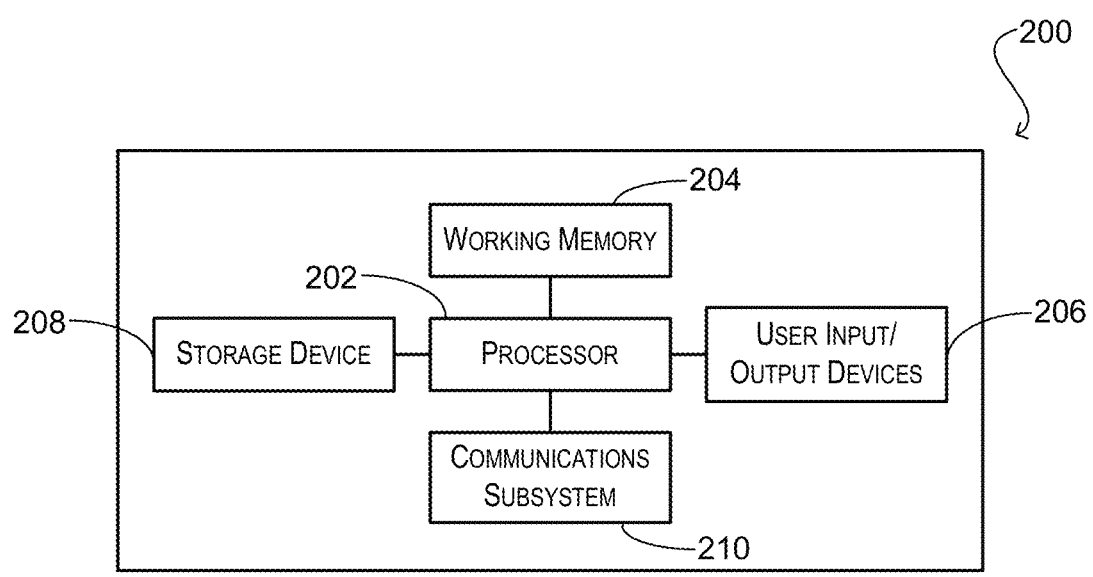
FIG. 2 is a simplified block diagram of an electronic device according to an embodiment of the present invention.

FIG. 2 is a simplified block diagram of an electronic device 200 according to an embodiment of the present invention. In various embodiments, electronic device 200 can be used to implement source device 102 or remote control device 108 of FIG. 1. As shown, electronic device 200 can include a processor 202, a working memory 204, user input/output devices 206, a storage device 208, and a communications subsystem 210.

Processor 202 can be implemented as one or more integrated circuits, such as a microprocessor or microcontroller. Processor 202 can be responsible for carrying out one or more operations of electronic device 200. For example, processor 202 can select and play media assets or execute various application programs stored in storage device 208. Processor 202 can also manage communication with other devices, such as audio output devices 104, 106 and remote control device 108 of FIG. 1, via communications subsystem 210.

Working memory 204 can include one or more volatile memory devices (e.g., RAM) for temporarily storing program code such as operating system code, application code, and the like that is executable by processor 202.

User input/output devices 206 can be any of a number of devices that allow a user to interact with electronic device 200. For example, such user input/output devices can include scroll wheels, buttons, keyboards, trackballs, touch-pads, microphones, speakers, touch-screen displays, and so on. In various embodiments, the user can operate a particular user input device 206 to invoke the functionality of electronic device 200. In addition, a user can view and/or hear output from electronic device 200 via a particular user output device 206.

Storage device 208 can be implemented, for example, using magnetic disk, flash memory, and/or any other non-volatile storage medium. In some embodiments, storage device 208 can include non-removable storage components such as a non-removable hard disk drive or flash memory drive. In other embodiments, storage device 208 can include removable storage media such as flash memory cards. Storage device 208 can provide storage for any programs and/or data used by electronic device 200. For example, storage device 208 can store media assets such as audio, video, still images, or the like, and associated metadata (e.g., asset name, artist, title, genre, playlists, etc.). Storage device 208 can also store information other than media assets, such as information about a user's contacts (names, addresses, phone numbers, etc.); scheduled appointments and events; notes; and/or other personal information. In still other embodiments, storage device 208 can store one or more programs to be executed by processor 202, such as personal information management programs, programs for playing media assets and/or navigating a media asset database, and so on.

Communications subsystem 210 can include a number of signal paths configured to carry various signals between electronic device 200 and one or more other devices. In one set of embodiments, communications subsystem 210 can include a 30-pin serial connector corresponding to the connector used on the iPod, iPhone, and iPad. Alternatively or additionally, communications subsystem 210 can include other wired (e.g., USB, Firewire, Ethernet, etc.) or wireless (e.g., WiFi, Bluetooth, cellular, IR, RF, etc.) interfaces.

It should be appreciated that electronic device 200 is illustrative and not intended to limit embodiments of the present invention. For example, electronic device 200 may have other capabilities or include other components that are not specifically described. One of ordinary skill in the art will recognize many variations, modifications, and alternatives.

As discussed above, in various embodiments source device 102 (or remote control device 108) can generate and present a user interface with a number of volume controls for controlling the volumes of audio output devices 104, 106. For example, the user interface can include an individual volume control for controlling each audio output device 104, 106 individually, as well as a master volume control for controlling audio output devices 104, 106 collectively. In certain embodiments, when the master volume control is manually adjusted, the individual volume controls can be automatically adjusted in a manner proportional to the manual adjustment of the master volume control. Thus, the master volume control can globally modify the volumes of audio output devices 104, 106. Further, when an individual volume control is manually adjusted to a setting or value that exceeds the master volume control, the master volume control can be automatically adjusted to be equal to, or greater than, the manually adjusted setting for the individual volume control. Thus, users can override the master volume control when they want, for example, audio output device 104 to be louder than the volume ceiling imposed by the previous master volume control setting, without affecting the current volume level of audio output device 106.

Figure 3:
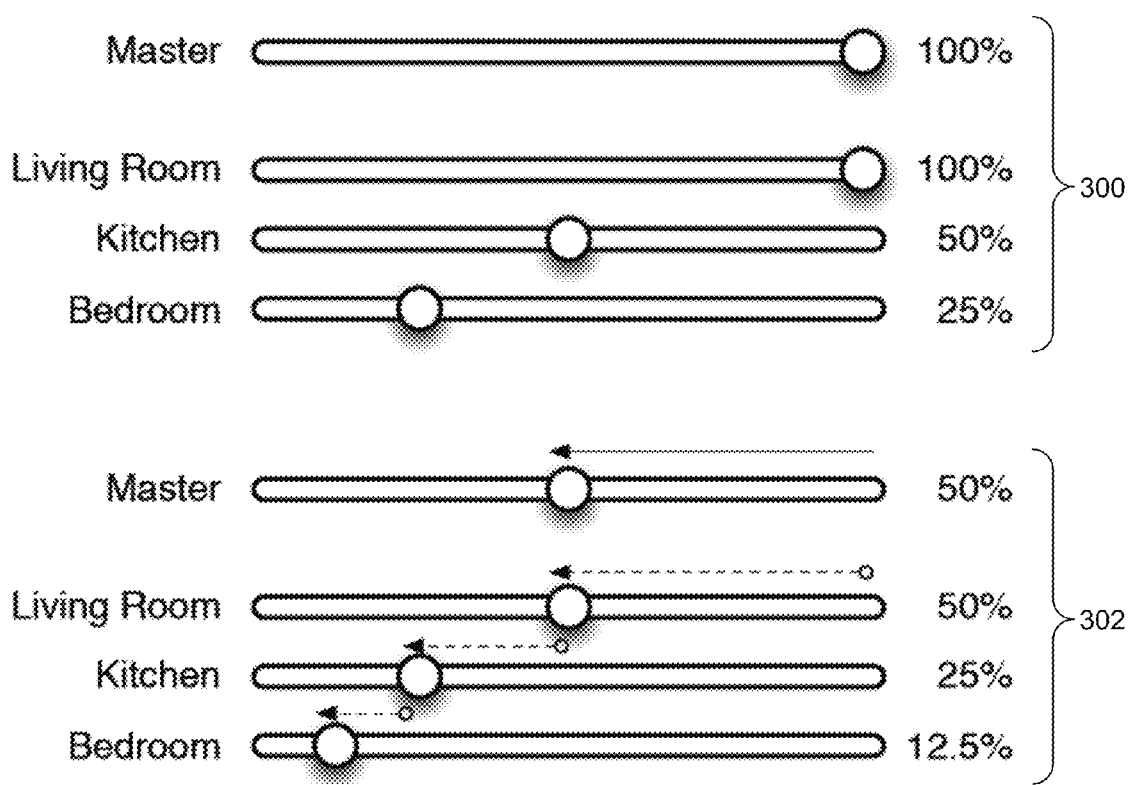
FIGS. 3-5 are simplified representations of user interfaces including individual and master volume controls according to an embodiment of the present invention.

FIG. 3 depicts simplified representations of a volume control user interface according to an embodiment of the present invention. In particular, FIG. 3 depicts the user interface in two states (300 and 302) that illustrate how a manual adjustment of the master volume control can cause automatic adjustments of the individual volume controls. In various embodiments, the volume control user interface can be generated and displayed by source device 102 or remote control device 108 of FIG. 1.

State 300 illustrates an initial state of the volume control user interface where the master volume control is set to its maximum value or setting (100%), and where the individual volume controls (living room, kitchen, bedroom) are set to various other values. In one set of embodiments, the setting for each individual volume control in state 300 can be considered the "ceiling" for that volume control, since the master control (which collectively controls the individual controls) is at its maximum (i.e., cannot be set any higher). In this particular example, the volume ceiling for the living room control is 100% (1:1 correlation with the master control), the volume ceiling for the kitchen control is 50% (1:2 correlation with the master control), and the volume ceiling for the bedroom control is 25% (1:4 correlation with the master control).

In certain embodiments, when the master volume control is manually adjusted by a user, the individual volume controls can be automatically adjusted in a manner proportional to the manual adjustment of the master. For instance, state 302 illustrates an example where the master volume control is reduced to 50% (a reduction of 50%). This can cause each of the individual volume controls to be automatically reduced by 50% (e.g., living room control reduced from 100% to 50%, kitchen control reduced from 50% to 25%, and bedroom control reduced from 25% to 12.5%). In this manner, the master volume control can globally modify the values of the individual volume controls (and thus, the output levels of the associated audio output devices), while preserving the relative volume differences between the devices.

In one set of embodiments, each individual volume control shown in the volume control user interface can indicate the current absolute volume level of its corresponding audio output device. In other words, the individual volume control can be adjustable over a range representing the full volume range of the audio output device, and the setting or value for the individual volume control can represent the current volume level of the device relative to that range. This can apply regardless of whether the individual volume control is manually adjusted by a user, or automatically adjusted in response to an adjustment of the master volume control. For example, in state 300 the absolute volume level of the living room audio output device is 100%, and in state 302 the absolute volume level of the living room audio output device is 50%. Thus, the user interface can accurately indicate the current "loudness" of each audio output device, which still allowing users to control them collectively.

Figure 4:
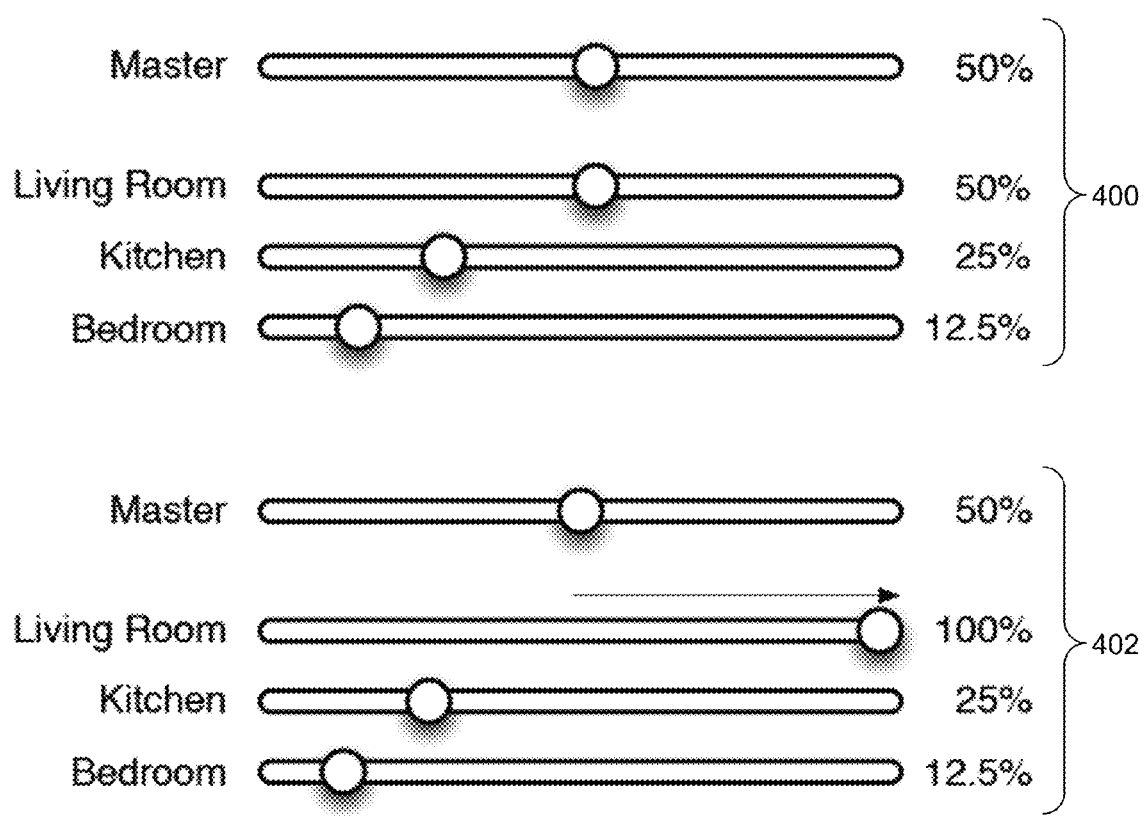
Figure 5:
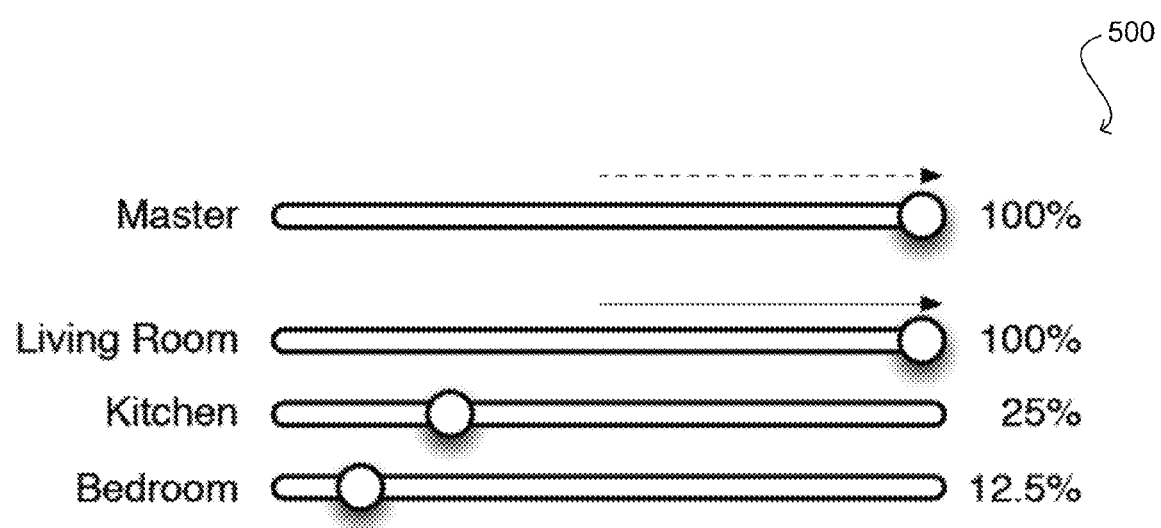

FIGS. 4 and 5 depict additional states (400, 402, and 500) of the volume control user interface that illustrate how, in some circumstances, a manual adjustment of an individual volume control can cause an automatic adjustment of the master volume control.

For example, consider state 400 where the master control is set to 50%, the living room control is set to 50%, the kitchen control is set to 25%, and the bedroom control is set to 12.5%. In this situation, the user may want to make the living room audio output device louder. Since user interface 300 allows users to adjust the volume of each audio output device individually using the individual volume controls, the user may decide to increase the living room control from 50% to 100% (as shown in state 402).

However, this creates an invalid state, since the living room control is now set to 200% of the master control, thereby breaking the proportional scaling between the two controls. For instance, subsequently increasing the master volume control to 100% will have no effect on the living room audio output device, since it is already set to its maximum volume.

To address this, the master volume control can be automatically adjusted to follow the living room volume control. This is shown in state 500 of FIG. 5, where the master control has been automatically increased to 100%. Thus, in certain embodiments, the master volume control can always be equal to, or greater than, the highest volume setting of its subordinate individual volume controls. This allows the proportional scaling between the master and individual controls to be preserved.

In a particular embodiment, when the master volume control is automatically adjusted upwards in response to the adjustment of an individual volume control, the values of the remaining individual volume controls can remain unchanged. For example, as shown in FIG. 5, the values for the kitchen and bedroom controls remain at 25% and 12.5% respectively. This is because the user did not intend to change the volume levels in the kitchen and bedroom by modifying the volume control for the living room. It should be noted that, by keeping the values of the kitchen and bedroom controls constant (while automatically adjusting the master), the correlations between the kitchen and bedroom controls and the master control are effectively recalibrated. For example, the correlation between the kitchen control and the master control becomes 1:4 in state 500, whereas it was previously 1:2.

Figure 6:
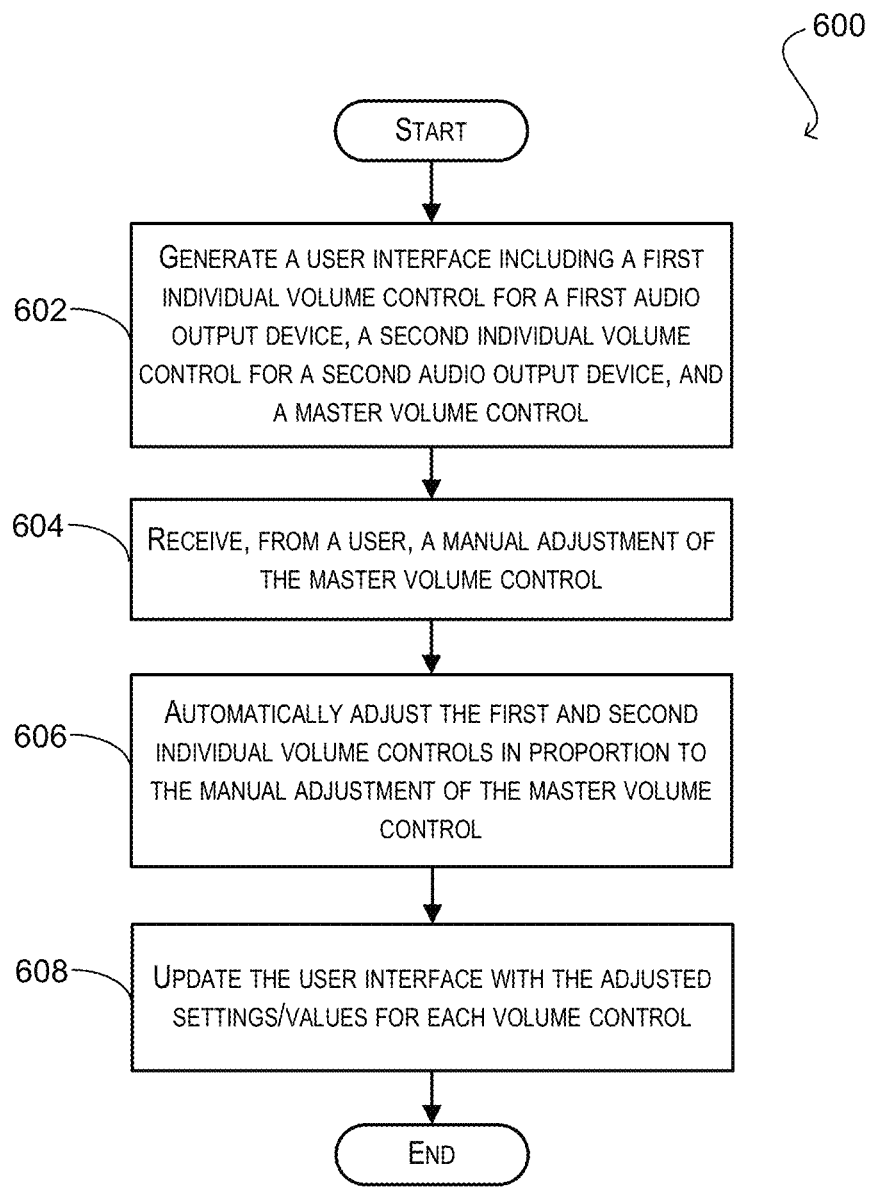
FIG. 6 is a flow diagram of a process for automatically adjusting an individual volume control in response to an adjustment of a master volume control according to an embodiment of the present invention.

FIG. 6 is a flow diagram of a process 600 for automatically adjusting an individual volume control in response to an adjustment of a master volume control according to an embodiment of the present invention. Process 600 is a flow-based representation of the processing described with respect to FIG. 3. In one set of embodiments, process 600 can be performed by source device 102 or remote control device 108 of FIG. 1. Process 600 can be implemented in hardware, software, or a combination thereof. As software, process 600 can be encoded as program code stored on a machine-readable storage medium.

At block 602, device 102/108 can generate a user interface including a first individual volume control for controlling the volume of a first audio output device, a second individual volume control for controlling the volume of a second audio output device, and a master volume control for collectively controlling the volumes of the first and second audio output devices. As described with respect to FIG. 3, each individual volume control can be configured to indicate the current absolute volume level of its corresponding audio output device.

At block 604, device 102/108 can receive, from a user, a manual adjustment of the master volume control. In response, device 102/108 can automatically adjust the first and second individual volume controls in proportion to the manual adjustment of the master volume control (block 606). For example, if the setting/value for the master volume control was reduced by 50%, the settings/values for the first and second individual volume controls can also be reduced by 50% respectively. Thus, the master volume control can globally modify the volumes of the first and second audio output devices while preserving the relative volume differences, in percentage terms, between the devices.

Once the first and second individual volume controls have been automatically adjusted, the user interface can be updated to display the adjusted settings/values for each volume control (block 608). In addition, the device can transmit control signals reflecting the adjusted volume settings to audio output devices 104, 106 so that their volume levels can be modified appropriately. In embodiments where process 600 is performed by remote control device 108 rather than source device 102, device 108 can transmit the adjusted volume settings to source device 102.

It should be appreciated that process 600 is illustrative and that variations and modifications are possible. For example, steps described as sequential may be executed in parallel, order of steps may be varied, and steps may be modified, combined, added, or omitted. One of ordinary skill in the art will recognize many variations, modifications, and alternatives.

Figure 7:
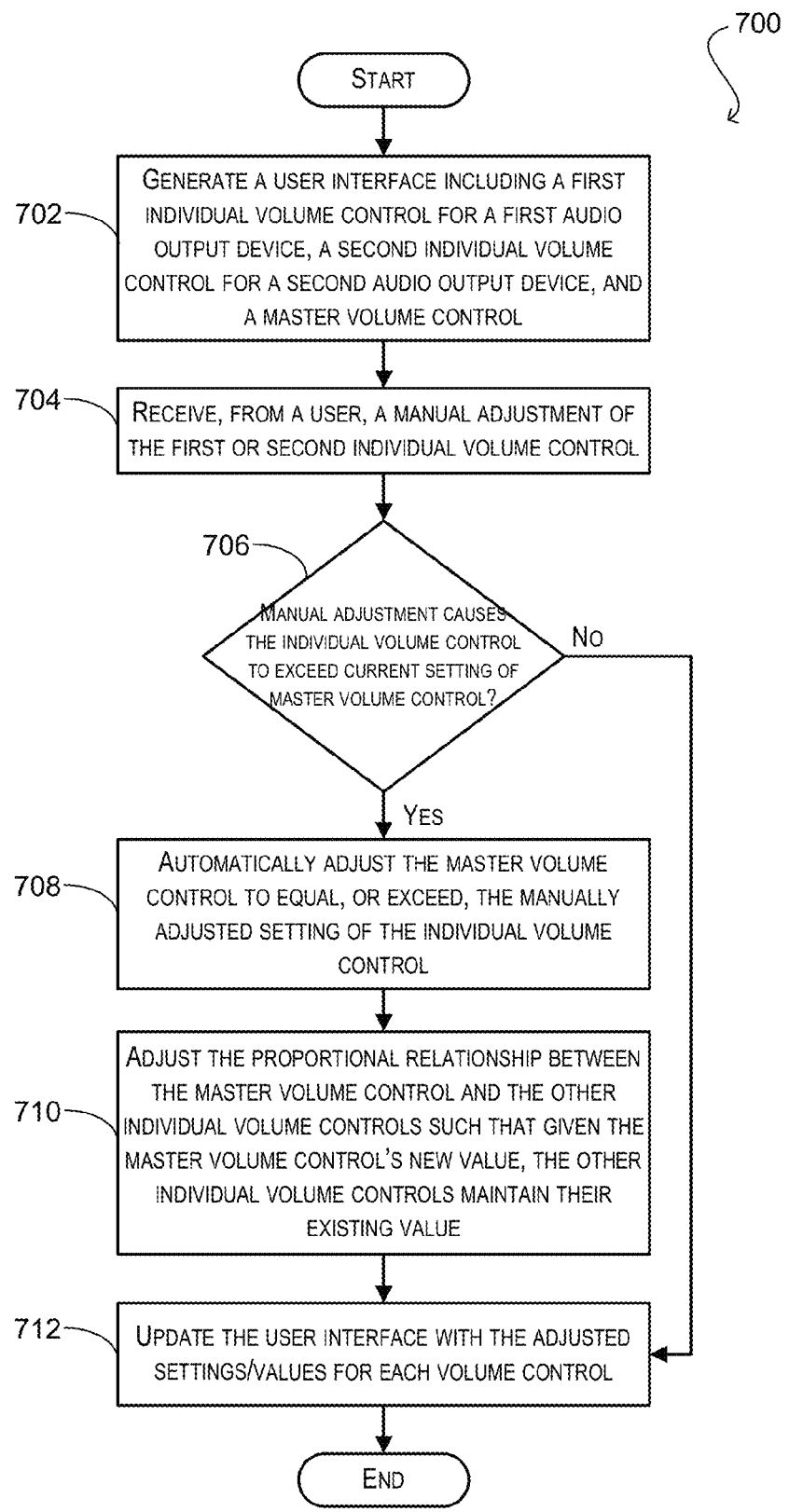
FIG. 7 is a flow diagram of a process for automatically adjusting a master volume control in response to an adjustment of an individual volume control according to an embodiment of the present invention.

FIG. 7 is a flow diagram of a process 700 for automatically adjusting a master volume control in response to an adjustment of an individual volume control according to an embodiment of the present invention. Process 700 is a flow-based representation of the processing described with respect to FIGS. 4 and 5. In one set of embodiments, process 700 can be performed by source device 102 or remote control device 108 of FIG. 1. Process 700 can be implemented in hardware, software, or a combination thereof. As software, process 700 can be encoded as program code stored on a machine-readable storage medium.

At block 702, device 102/108 can generate a user interface including a first individual volume control for controlling the volume of a first audio output device, a second individual volume control for controlling the volume of a second audio output device, and a master volume control for collectively controlling the volumes of the first and second audio output devices. In various embodiments, this user interface can be similar or identical to the user interface generated at block 602 of FIG. 6.

At block 704, device 102/108 can receive, from a user, a manual adjustment of the first or second individual volume control. Device 102/108 can then determine whether the manual adjustment causes the individual volume control to exceed the current setting/value for the master volume control (block 706).

If the current setting/value for the master volume control is exceeded, the master volume control can be automatically adjusted to equal, or exceed, the newly adjusted setting/value of the individual volume control (block 708). If the current setting/value for the master volume control is not exceeded, the master volume control is not adjusted.

In addition to automatically adjusting the master volume control at block 708, the proportional relationship between the master volume control and the other individual volume controls can be automatically adjusted such that, given the master's new value, the other individual volume controls remain unchanged (block 710). For example, as shown in FIG. 5, when the master volume control is automatically adjusted from 50% to 100% (in response to a manual adjustment of the living room volume control), the values for the kitchen and bedroom controls remain at 25% and 12.5% respectively. By keeping the values of the kitchen and bedroom controls constant (while automatically adjusting the master), the correlations between the kitchen and bedroom controls and the master control are effectively recalibrated.

At block 712, the user interface can be updated to display the adjusted settings/values for each volume control. In addition, the device can transmit control signals reflecting the adjusted volume settings to audio output devices 104, 106 so that their volume levels can be modified appropriately. In embodiments where process 700 is performed by remote control device 108 rather than source device 102, device 108 can transmit the adjusted volume settings to source device 102.

It should be appreciated that process 700 is illustrative and that variations and modifications are possible. For example, steps described as sequential may be executed in parallel, order of steps may be varied, and steps may be modified, combined, added, or omitted. One of ordinary skill in the art will recognize many variations, modifications, and alternatives.

Figure 8:
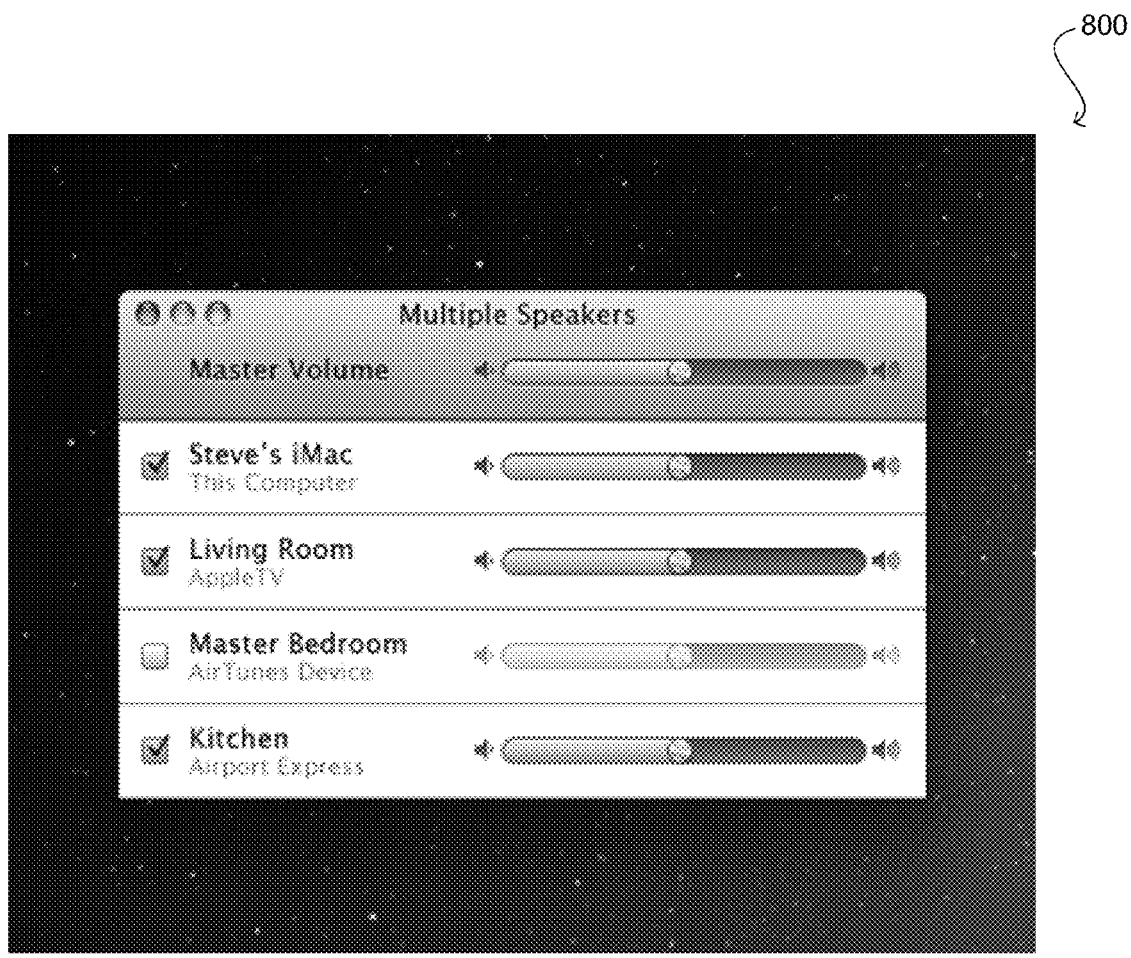
FIGS. 8-10 are screenshots of example user interfaces including individual and master volume controls according to embodiments of the present invention.
Figure 9:
Figure 10:

FIGS. 8-10 are screenshots of example user interfaces 800, 900, and 1000 that include individual and master volume controls according to embodiments of the present invention. For instance, user interface 800 is an example UI that can be generated by a source device such as a computer system, and user interfaces 900 and 1000 are example UIs that can be generated by a remote control device such as a portable media device. It should be appreciated that user interfaces 800, 900, 1000 are provided for illustration purposes and that other configurations/representations are possible. For example, although the volume controls in user interfaces 800, 900, 1000 are represented using "sliders," they can also be represented using any other type of user interface element that enables a user to select a value from a range of values. One of ordinary skill in the art will recognize other variations, modifications, and alternatives.

As described in the foregoing disclosure, embodiments of the present invention enable both individual and collective volume controls for controlling multiple audio output devices. In one set of embodiments, each individual volume control can be configured to display the absolute volume level for its corresponding audio output device. Accordingly, the individual volume control can accurately represent the full volume range of the device, as well as the current volume of the device relative to that range.

In further embodiments, the master volume control can represent the full range of sound available across the entire audio system. If the master volume control is adjusted to its maximum setting (e.g., 100%), that indicates that each of the audio output devices is at its volume "ceiling" (as defined by its individual volume control). If the master volume control is adjusted to its minimum setting (e.g., 0%), that indicates that all audio output devices have become "silent".

In further embodiments, user can override the master volume control when they want an particular audio output device to be louder than the volume ceiling imposed by the previous master volume control setting, without affecting the current volume levels of other devices controlled by the master volume control.

In certain embodiments, the techniques described herein can be applied in a nested fashion, such that a master volume control for one set of individual volume controls can, in turn, be considered a subordinate volume control for a higher level master control. For example, consider a situation where a first master volume control M1 is configured to collectively control individual volume controls I1, I2, and I3, where I1 controls a speaker set in a user's kitchen, I2 controls a speaker set in the user's bedroom, and I3 controls a speaker set in the user's living room. Now assume that the user adds a second speaker set in the living room and wishes to control the two living room speaker sets individually or in parallel. In this case, a new individual volume control I4 can be added for the second living room speaker set, and a new master volume control M2 can be added for collectively controlling I3 and I4. In this scenario, master volume control M2 can be subordinate to master volume control M1, such that M1 can automatically adjust I1, I2, and M2 in parallel. Other types of master-subordinate control hierarchies are possible and are contemplated to be within the scope of the present invention.

While the invention has been described with respect to specific embodiments, one skilled in the art will recognize that numerous modifications are possible. In some embodiments, circuits, processors, and/or other components of a computer system or an electronic device may be configured to perform various operations described herein. Those skilled in the art will appreciate that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on. Further, while the embodiments described above may make reference to specific hardware and software components, those skilled in the art will appreciate that different combinations of hardware and/or software components may also be used and that particular operations described as being implemented in hardware can also be implemented in software or vice versa.

Computer programs incorporating some or all of the features described herein may be encoded on various machine-readable storage media; suitable media include magnetic disk (including hard disk) or tape, optical storage media such as compact disk (CD) or DVD (digital versatile disk), flash memory, and the like. Machine-readable storage media encoded with the program code may be packaged with a compatible device or provided separately from other devices. In addition, program code may be encoded and transmitted via wired, optical, and/or wireless networks conforming to a variety of protocols, including the Internet, thereby allowing distribution, e.g., via Internet download.

Thus, although the invention has been described with respect to specific embodiments, it will be appreciated that the invention is intended to cover all modifications and equivalents within the scope of the following claims.

What is claimed is:

1. A computer-implemented method, comprising:
providing, by an electronic device, a graphical interface including a master volume control and one or more individual volume controls, an individual volume control including a setting for controlling a volume of an individual audio output device and the master volume control including a setting for controlling the one or more individual volume controls;
receiving an adjustment of the setting of the individual volume control, wherein the adjustment of the setting of the individual volume control exceeds the setting of the master volume control; and
adjusting the setting of the master volume control in response to receiving the adjustment of the setting of the individual volume control that exceeds the setting of the master volume control, wherein when the graphical interface includes other individual volume controls, settings of the other individual volume controls corresponding to other audio output devices are not adjusted.

2. The method of claim 1, wherein the one or more individual volume controls includes one or more initial relationships with the master volume control prior to receiving the adjustment of the setting of the individual volume control, and wherein the method further comprises:
recalibrating a correlation between the one or more individual volume controls and the master volume control, the recalibration including calculating one or more new relationships between the master volume control and the one or more individual volume controls.

3. The method of claim 2, wherein at least one of the one or more initial relationships is different from at least one of the one or more new relationships.

4. The method of claim 1, wherein new relationships between the master volume control and the other individual volume controls are different from initial relationships between the master volume control and the other individual volume controls.

5. The method of claim 1, wherein the setting of the master volume control is automatically adjusted to be equal to, or greater than, the adjusted setting of the individual volume control.

6. The method of claim 1, further comprising:
receiving an adjustment of the setting of the master volume control; and
adjusting the setting of the individual volume control in response to receiving the adjustment of the setting of the master volume control.

7. The method of claim 6, wherein the setting of the individual volume control is adjusted in proportion to the adjustment of the setting of the master volume control.

8. The method of claim 1, wherein the setting of the individual volume control is configured to indicate a current absolute volume level of the individual audio output device.

9. The method of claim 1, wherein the setting of the individual volume control cannot exceed the setting of the master volume control.

10. A computer-implemented system, comprising:
one or more data processors; and
one or more non-transitory computer-readable storage media including instructions configured to cause the one or more data processors to perform operations including:
providing a graphical interface including a master volume control and one or more individual volume controls, an individual volume control including a setting for controlling a volume of an individual audio output device and the master volume control including a setting for controlling the one or more individual volume controls;
receiving an adjustment of the setting of the individual volume control, wherein the adjustment of the setting of the individual volume control exceeds the setting of the master volume control; and
adjusting the setting of the master volume control in response to receiving the adjustment of the setting of the individual volume control that exceeds the setting of the master volume control, wherein when the graphical interface includes other individual volume controls, settings of the other individual volume controls corresponding to other audio output devices are not adjusted.

11. The system of claim 10, wherein the one or more individual volume controls includes one or more initial relationships with the master volume control prior to receiving the adjustment of the setting of the individual volume control, and further comprising instructions configured to cause the one or more processors to perform operations including:
recalibrating a correlation between the one or more individual volume controls and the master volume control, the recalibration including calculating one or more new relationships between the master volume control and the one or more individual volume controls.

12. The system of claim 11, wherein at least one of the one or more initial relationships is different from at least one of the one or more new relationships.

13. The system of claim 10, wherein new relationships between the master volume control and the other individual volume controls are different from initial relationships between the master volume control and the other individual volume controls.

14. The system of claim 10, wherein the setting of the master volume control is automatically adjusted to be equal to, or greater than, the adjusted setting of the individual volume control.

15. The system of claim 10, further comprising instructions configured to cause the one or more processors to perform operations including:
receiving an adjustment of the setting of the master volume control; and
adjusting the setting of the individual volume control in response to receiving the adjustment of the setting of the master volume control.

16. The system of claim 15, wherein the setting of the individual volume control is adjusted in proportion to the adjustment of the setting of the master volume control.

17. The system of claim 10, wherein the setting of the individual volume control is configured to indicate a current absolute volume level of the individual audio output device.

18. The system of claim 10, wherein the setting of the individual volume control cannot exceed the setting of the master volume control.

19. A computer-program product tangibly embodied in a non-transitory machine readable storage medium, including instructions configured to cause a data processing apparatus to:

provide a graphical interface including a master volume control and one or more individual volume controls, an individual volume control including a setting for controlling a volume of an individual audio output device and the master volume control including a setting for controlling the one or more individual volume controls;

receive an adjustment of the setting of the individual volume control, wherein the adjustment of the setting of the individual volume control exceeds the setting of the master volume control; and adjust the setting of the master volume control in response to receiving the adjustment of the setting of the individual volume control that exceeds the setting of the master volume control, wherein when the graphical interface includes other individual volume controls, settings of the other individual volume controls corresponding to other audio output devices are not adjusted.

20. The computer-program product of claim 19, wherein the one or more individual volume controls includes one or more initial relationships with the master volume control prior to receiving the adjustment of the setting of the individual volume control, and further comprising instructions configured to cause the data processing apparatus to:

recalibrate a correlation between the one or more individual volume controls and the master volume control, the recalibration including calculating one or more new relationships between the master volume control and the one or more individual volume controls.

21. The method of claim 1, wherein the relationship between the setting of the master volume control and one of the settings of the other individual volume controls is adjusted based on an amount that the setting of the individual volume control exceeded the setting of the master volume control.

* * * * *